United States Patent
Wichman et al.

(10) Patent No.: US 10,090,426 B2
(45) Date of Patent: Oct. 2, 2018

(54) DARK CURRENT MITIGATION WITH DIFFUSION CONTROL

(71) Applicants: TRUSTEES OF BOSTON UNIVERSITY, Boston, MA (US); Adam R. Wichman, Dover, MA (US); Enrico Bellotti, Watertown, MA (US); Benjamin James Pinkie, Cambridge, MA (US)

(72) Inventors: Adam R. Wichman, Dover, MA (US); Enrico Bellotti, Watertown, MA (US); Benjamin James Pinkie, Cambridge, MA (US)

(73) Assignee: Trustees of Boston University, Boston, MA (US)

( * ) Notice: Subject to any disclaimer, the term of this patent is extended or adjusted under 35 U.S.C. 154(b) by 0 days.

(21) Appl. No.: 15/308,948

(22) PCT Filed: May 5, 2015

(86) PCT No.: PCT/US2015/029184
§ 371 (c)(1),
(2) Date: Nov. 4, 2016

(87) PCT Pub. No.: WO2015/171572
PCT Pub. Date: Nov. 12, 2015

(65) Prior Publication Data
US 2017/0077329 A1    Mar. 16, 2017

Related U.S. Application Data

(60) Provisional application No. 62/121,024, filed on Feb. 26, 2015, provisional application No. 61/988,475, filed on May 5, 2014.

(51) Int. Cl.
*H01L 31/0352* (2006.01)
*H01L 31/0296* (2006.01)
(Continued)

(52) U.S. Cl.
CPC .... *H01L 31/03529* (2013.01); *H01L 27/1446* (2013.01); *H01L 31/02005* (2013.01);
(Continued)

(58) Field of Classification Search
CPC ......... H01L 31/03529; H01L 31/02005; H01L 31/022408; H01L 27/1446;
(Continued)

(56) References Cited

U.S. PATENT DOCUMENTS 4,242,695 A    12/1980  Ouchi et al.
5,016,073 A *  5/1991   Elliott ................ H01L 31/101
                                                    257/184
(Continued)

*Primary Examiner* — Fernando L Toledo
*Assistant Examiner* — Adam S Bowen
(74) *Attorney, Agent, or Firm* — Preti Flaherty Beliveau & Pachios LLP

(57) ABSTRACT

A photosensor device for reducing dark current is disclosed. The photosensor device includes a photon absorbing layer and two or more photosensor diffusions in said absorbing layer. The photosensor diffusions in the absorbing layer have edges of their diffusions separated in said absorbing layer by less than two minority carrier diffusion lengths. The photosensor device also includes in one embodiment one or more diffusion control junction diffusions in the absorbing layer and in proximity to the photosensor diffusions. In another embodiment the photosensor diffusions are selectively biased to operate as photosensor diodes or as diffusion impediments.

19 Claims, 16 Drawing Sheets

(51) Int. Cl.
*H01L 31/101* (2006.01)
*H01L 31/18* (2006.01)
*H01L 27/144* (2006.01)
*H01L 31/02* (2006.01)
*H01L 31/0224* (2006.01)

(52) U.S. Cl.
CPC ............... *H01L 31/02966* (2013.01); *H01L 31/022408* (2013.01); *H01L 31/1013* (2013.01); *H01L 31/184* (2013.01); *Y02E 10/544* (2013.01)

(58) Field of Classification Search
CPC ........... H01L 31/02966; H01L 31/1013; H01L 31/184; Y02E 10/544
USPC ........................................................ 257/440
See application file for complete search history.

(56) References Cited

U.S. PATENT DOCUMENTS

| | | | |
|---|---|---|---|
| 5,811,842 A * | 9/1998 | Funaba | H01L 31/103 257/184 |
| 2009/0020841 A1 | 1/2009 | Hu et al. | |
| 2014/0084135 A1 | 3/2014 | Chen et al. | |

\* cited by examiner

DARK CURRENT MITIGATION WITH DIFFUSION CONTROL

STATEMENT REGARDING FEDERALLY SPONSORED RESEARCH OR DEVELOPMENT

This invention was made with Government Support under Contract No. W911NF-12-2-0023 awarded by the Army Research Laboratory (ARL). The Government has certain rights in the invention.

FIELD OF THE INVENTION

The invention relates to photodiode structures for sensing light radiation, as well as systems and methods for reducing dark current using diffusion control junctions and/or adaptive bias to suppress minority carrier densities.

INTRODUCTION

Modern photodetectors commonly use photodiodes for light sensing. Many applications require sensing low light levels, thereby requiring highly sensitive photodetectors. Thermally generated carriers limit the signal to noise ratio that photodiodes can provide in response to low light level signals. Without any external illumination or signal, e.g., under dark conditions, photodiodes provide a dark current or thermally generated potential. The dark current can limit detectable flux levels in background limited photon detection, and can introduce additional unwanted Johnson, shot, generation/recombination, 1/f, temperature or popcorn noise.

The primary contributions to dark current include diffusion currents from carriers that are thermally generated through material-dependent intrinsic processes like Auger recombination, tunneling, or radiative recombination. Shockley-Read-Hall traps or generation-recombination centers located in a depletion region near a photodiode metallurgical junction contribute thermally generated carriers to a generation-recombination (GR) dark current component. Material imperfections such as interface states introduced during photodiode manufacture can also contribute thermally generated carriers to dark currents.

The probability of a thermally generated process contributing carriers to a diffusion current is generally proportional to $\exp(-E_g/kT)$, while the probability of a GR event contributing carriers to a GR current is generally proportional to $\exp(-E_g/2kT)$, with $E_g$ representing the material bandgap. As a result, at low temperatures the GR component tends to become the dominant dark current component. At high temperatures, by contrast, diffusion tends to dominate the dark current. A photodiode with dark current at levels explained by diffusion currents is diffusion limited.

In a photodiode, the p-n junction separates charges with the electric field in a depletion or band bending region moving holes to p type and electrons to n type regions. Outside a depletion region photogenerated carriers, like the thermally generated carriers in diffusion currents, generally move by diffusion rather than drift. On average the carriers can move a particular diffusion length before recombining. The diffusion length is generally related to material properties, such as carrier mobility, effective masses, electronic structure, recombination lifetimes, or doping levels, as well as operating conditions like temperature. A freestanding photodiode is therefore expected, on average, by diffusion to collect carriers, originating within a diffusion length of a depletion region around the p-n junction, which fail to recombine in the bulk material before reaching the depletion region.

Several efforts have been made to improve photodetector sensitivity by reducing dark current. Each approach, however, introduces its own tradeoffs and shortcomings. One common solution is simply to operate photodetectors at low temperature, thereby reducing diffusion currents and generally increasing the relative GR current contribution to dark current. Cooling, however, introduces undesirable size, weight, and power requirements on device design, form factor, and operation, and can be inconsistent with operability requirements. The GR current, moreover, falls off more slowly with temperature than diffusion currents.

Manufacturing improvements providing high quality materials can reduce dark current from interface states. Better passivation strategies, such as using buried narrow gap absorbers located between widegap substrate and cap or contact layers in a double layer planar heterostructure (DLPH) can reduce surface interface currents. This strategy, however, does not mitigate the diffusion or GR current contributions to dark current. This strategy also relies on expensive improvements to manufacturing technology over long time frames.

Because diffusion and GR currents depend on the size of material bandgap, placing photodiode p-n junctions in a widegap material rather than a narrowgap absorber can reduce both contributions to dark current at the junction. In a DLPH structure, at a given temperature such a widegap junction will collect lower diffusion and GR currents from the widegap material, while conduction and/or valence band offsets at a heterointerface can block diffusion currents from the narrowgap material. In this structure, however, the same conduction or valence band offsets at the heterointerface also reduce photocurrent collection from the absorber, reducing quantum efficiency at a given bias and, conversely, introducing bias dependent quantum efficiencies. In some cases fully depleting a narrowgap absorber can reduce some dark currents. For example, high operating temperature (HOT) detectors can reduce Auger recombination carriers in high temperature HgCdTe by using the electric field in a depletion region to extract carriers rapidly, before they can recombine in an Auger mechanism and draw in new carriers to preserve charge neutrality, thereby reducing dark current. By increasing the depletion volume, however, this strategy increases GR contributions to dark current.

By replacing a p-n junction with a thin barrier layer having particular conduction band and valence band alignments with absorber and contact layers, nBn (xBn or xBp) detectors use the band alignment with the barrier layer for charge separation without introducing a depletion region in a narrow gap absorber. This strategy reduces GR contributions to dark current. When used in photodetecting arrays, however, nBn detectors often suffer from higher crosstalk than conventional photodiodes. These detectors rely on specific bandgap engineering approaches and are thus limited to particular materials that meet these requirements. Because the nBn detector does not reduce diffusion currents, moreover, such detectors require meeting size, weight, and power constraints associated with cooling detectors to levels where, in a photodiode, GR currents would dominate dark current.

Reducing photodiode junction dimensions and selecting suitable doping levels can reduce the volume of a depletion region in a narrow gap absorber, while also reducing the prevalence of defects introduced by manufacturing processes to diffuse dopants, thereby reducing GR and defectrelated interface currents. As a result, shallow buried homojunctions in a DLPH structure can provide diffusion-limited photodetection at low bias. This strategy, however, does not reduce the diffusion contribution to dark current.

There is, accordingly, need for photodetectors having reduced dark current while mitigating or avoiding the tradeoffs described for various strategies above, such as size, weight, or power constraints associated with cooling the detector.

Array geometry provides a mechanism to suppress dark current. In high-density format photodetector arrays, for example, absorber thickness and the distance between adjacent photodiodes may both be less than a diffusion length. Of course there is no need for a high-density format in order to place photodiodes within a minority carrier diffusion length from each other. At uniform reverse bias, the photodiodes in such arrays on average will not collect carriers originating within a full diffusion length of the photodiode. Instead, the array geometry generally imposes new boundary conditions on the carrier diffusion.

The photodiode placement in such an array notionally defines a geometric plane (a symmetry plane) or surface (membrane) through the bulk absorber, normal to and at a midpoint on a notional line joining two proximate photodiodes. When such a plane is a minority carrier diffusion length or less from the junction edge, or, more particularly, the edge of a depletion region, around either photodiode, then the array's photodiode disposition imposes the dense array boundary condition. Under these conditions, there will be no net steady state diffusion of minority carriers initially located on this plane towards either proximate photodiode.

As explained in Wichman, A. R., DeWames, R. E. and Bellotti, E., "Three dimensional numerical simulation of planar $P^+n$ heterojunction $In_{0.53}Ga_{0.47}As$ photodiodes in dense arrays Part I: Dark current dependence on device geometry," Proceedings of SPIE 9070, 907003 (2014) the photodiode array geometry under these conditions can suppress dark current. This influence on carrier diffusion by neighboring photodiodes tends to suppress steady state carrier densities at the symmetry plane, and confines the lateral collection distance for carrier collection by a photodiode to less than a diffusion length in the region bounded by the symmetry planes. This also tends to reduce the minority carrier gradient at the edge of a depletion region around each photodiode, meaning that this geometric influence by neighboring photodiodes suppresses the diffusion current contribution to dark current. In other words, a freestanding photodiode will have higher diffusion current, and thus higher dark current, compared to the same photodiode when located in a dense array under the same operating conditions.

Although this effect has been incidentally observed in high density format arrays, photodetector array designs and operation have not specifically applied the minority carrier and minority carrier gradient suppression mechanisms provided by junction bias and placement to selectively suppress dark current in sensing photodiodes.

Unlike the freestanding diode, in the dense array the minority hole density never returns to intrinsic levels (the excess remains negative) but reaches a steady state maximum midway between neighboring diodes. This means that on average the steady state dark diffusion current in the uniformly reverse biased dense array only collects carriers laterally to the minority carrier maxima between neighboring diodes. More particularly, the minority carrier density inter-pixel maximum remain below the intrinsic steady state values. The smaller difference between the minimum in minority carriers below the signal junctions, and the minority carrier inter-pixel maximum, than between the minimum and the intrinsic minority carrier density, means that the dense array minority carrier gradient is lower (and the dark diffusion current is lower) than would be obtained for the single diode in a bulk absorber. The effect of the uniformly-reverse biased dense array, in other words, is to confine the steady state lateral diffusion carrier collection to a pixel volume, much like the internal volume defined by the prior art guard junction.

Accordingly, there remains a need for an architecture or mechanisms to suppress lateral dark diffusion currents originating within any given pixel in a dense array, while minimizing fill factor penalties and providing practical manufacturability.

BRIEF SUMMARY

In a first alternative, the present invention relates to a photodetector array capable of providing reduced dark diffusion current, comprising one or more diffusion control junctions and a plurality of photodiodes. The photodiodes generate output signals in relation to incident radiation, with the output signal comprising photocurrent related to incident light intensity, and dark current independent of incident light intensity. The diffusion control junctions are configured to suppress minority carrier density gradients in photon absorbing layers proximate to each diffusion control junction, thereby reducing dark current in the photodiode output signal, thereby acting as dark current impediments.

In another alternative, the present invention relates to a photodetecting system comprising a photodetector array with bias and output circuits, the system providing reduced dark diffusion current and dark current noise. The photodetector array comprises a plurality of photodiodes. The photodetector system is configured to selectively apply reverse bias on a plurality of photodiodes, while applying a lower reverse bias on one or more other photodiodes. The photodiodes subject to lower reverse bias are sensing diodes. The photodiodes subject to the higher reverse bias are capable of suppressing minority carrier densities, i.e. dark current impediments in the photon absorbing layer proximate to the sensing diodes, which are capable of providing output signals having reduced dark current contributions.

In another alternative, the present invention relates to methods of detecting incident radiation signals with photodiode arrays having reduced dark current.

DETAILED DESCRIPTION OF THE INVENTION

The disclosures of U.S. Provisional Application 61/988,475 filed May 5, 2014 and U.S. Provisional Application 62/121,024 filed Feb. 26, 2015 are hereby incorporated by reference.

The present invention provides structures, systems, and methods for detecting radiation with reduced photodetector dark diffusion currents, thereby obtaining photodetection signals with reduced dark current. As described herein, the invention suppresses lateral dark diffusion currents in photodetecting arrays. Because diffusion currents tend to dominate dark current at higher temperatures, the invention described herein provides mechanisms and methods for operating photodetectors at higher temperatures with dark current comparable to existing photodetectors at lower temperature operation, or for reducing dark current and improving performance at existing photodetector operating temperatures. This provides lower power requirements for cooling, and potentially smaller size and weight by reducing the cooling and power requirements, and other benefits associated with lower power requirements.

In addition, dark diffusion current, and its proportion in total dark current, increases in temperature more quickly than GR current. As a result, unlike dark current mitigation techniques focused on reducing operating temperature or the size of GR currents, because the invention suppresses lateral dark diffusion current, it can provide proportionally greater dark current suppression as temperature increases.

Figure 1:
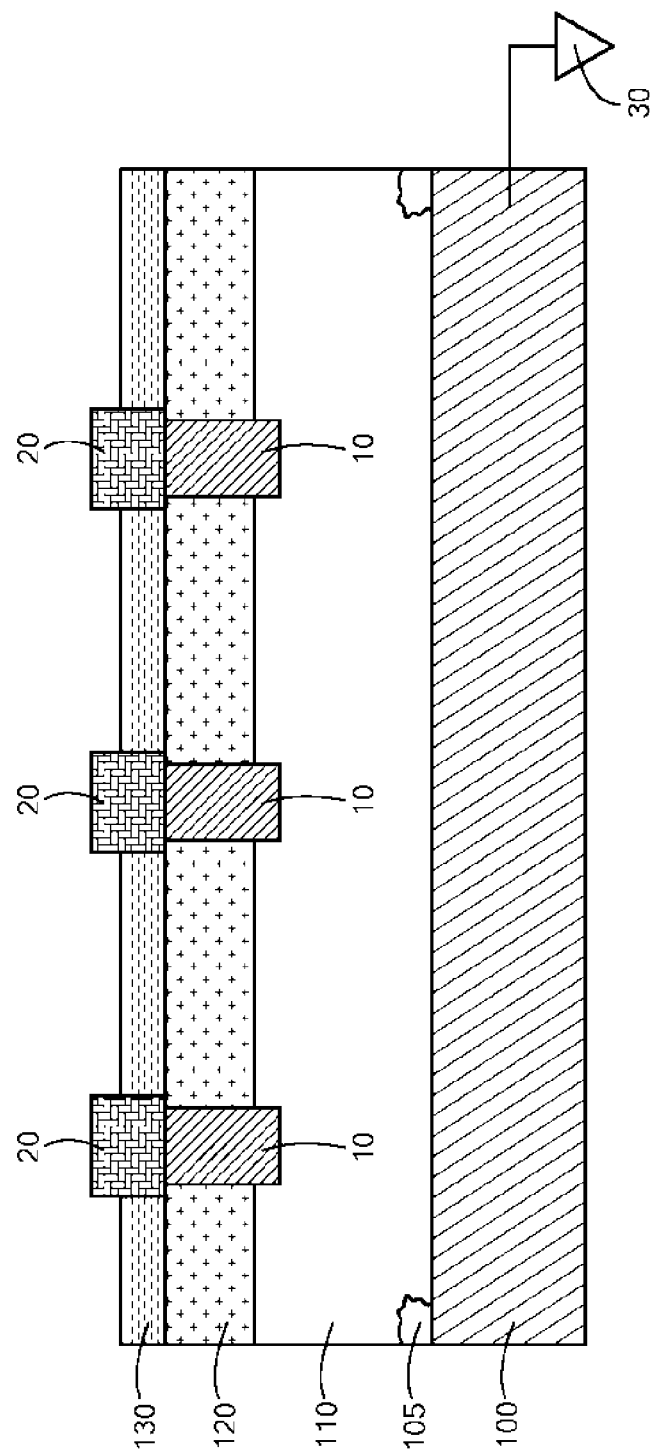
FIG. 1 shows in cross section portions of an exemplary conventional backside illuminated double layer planar heterostructure (DLPH) photodetecting array.

These and other advantages provided by the invention are more easily understood by reference to the figures. FIG. 1 shows in cross section an exemplary conventional prior art backside illuminated DLPH photodetecting array. The DLPH typically comprises a widegap substrate layer 100, a narrowgap absorber layer 110, and a widegap cap or contact layer 120. For example, a short wave infrared detector using this structure can use substrate 100 and cap 120 layers comprising InP, with a lattice matched InGaAs alloy as absorber 110. The material systems used for each layer depend on the design and performance objectives for the photodetecting array and are well-known in the art. Representative choices of material system are discussed extensively, for example, in Rogalski, A. "HgCdTe infrared detector material: history, status and outlook," 68 *Reports on Progress in Physics* 2267-2336 (2005).

The conventional DLPH may include a passivation layer 130 on top of the cap or contact layer. During manufacture a buffer layer 105 may optionally be disposed between substrate 100 and absorber 110. The substrate, buffer, and absorber layer will generally have the same type intentional, or unintentional, doping (donor or acceptor). In one embodiment substrate 100 and/or absorber 110 are electronically connected to common terminal 30, providing a device ground or other reference potential.

Diffusion, ion implantation, or other known methods can be used to form a region 10 having doping with the opposite polarity from the bulk absorber layer 110 or, if the absorber is intrinsic, bulk substrate layer 100. The boundary between such a diffusion 10 and the oppositely doped bulk material (110 or 120) defines a p-n junction. For example, as shown in FIG. 1, bulk absorber 110 may be doped n type while the diffusion is doped p type. Because the widegap cap layer 120 forms a heterointerface at the layer boundary with the narrowgap absorber 110 that may introduce band offsets that block minority carrier transport, conventional DLPH structures such as those used in infrared sensing generally locate the p-n junction at a shallow depth in the absorber below the top heterointerface forming a homojuction. The diffusion 10 and bulk absorber 110, with the p-n junction, form a photodiode.

Such DLPH structures can be formed by molecular beam epitaxy (MBE), metal organic chemical vapor deposition (MOCVD), sputtering, e-beam evaporation, or other methods well-known in the art. For example, in one embodiment the DLPH structure in FIG. 1 can be a P+ n $N^+$ structure with an $N^+$ InP substrate 100, n-type lattice-matched InGaAs absorber 110, and n-type InP cap 120. Passivation layer 130 may be formed from a SiN alloy. DLPH structures can also be formed, for example, as p-n or n-p HgCdTe arrays on CdTe, CdZnTe, sapphire or Si substrates, and in many other material systems including, for example, Si/Ge/Ge, InAsSb/GaSb/AlGaSb, InAs/GaSb/GaAs. See generally Rogalski, A. "Infrared detectors: status and trends," 27 *Progress in Quantum Electronics* 59-210, Table 1 at 67 (2003) (intrinsic and quantum well photon detectors.

Metallic contacts 20 are formed in electrical communication with each diffusion 10. As shown in FIG. 1, the substrate 100 or absorber 110 is generally electrically connected to a common potential 30. The metallic contacts can be formed from gold, indium, or a suitable alloy depending on the material system used for the photodiodes and photodetector array. While FIG. 1 shows solid contacts for a backside illuminated configuration, it is understood that contacts can include apertures if used in a front side illumination architecture.

Figure 7A:
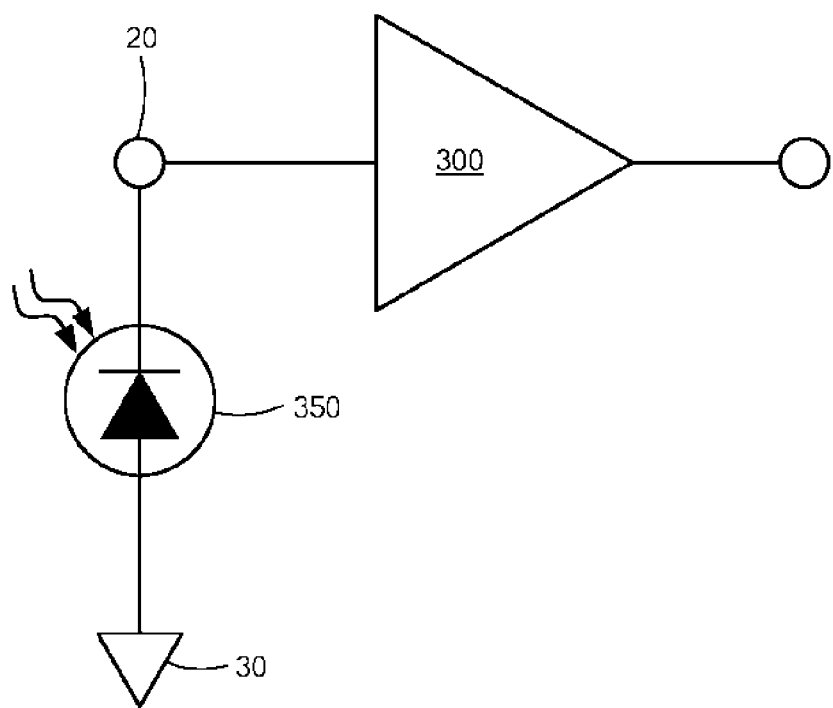
FIGS. 7(a)-7(c), collectively referred to as FIG. 7, show functional diagrams for read out electronics and biasing electronics in relation to a photodiode array.

The photodetector array is connected to biasing and read out electronics (FIG. 7(a)) to form a focal plane array (FPA). Design and fabrication of read out integrated circuits (ROIC) and/or biasing electronics is well-known in the art, and well-known methods can connect biasing and readout electronics 300 to each contact 20 in communication with each photodiode(s) 350. For example, if electronics are fabricated in a different substrate or material system from the photodetectors, contacts 20 can comprise indium bumps electrically communicating with a ROIC through flip chip bonding. Alternatively, in a suitable material system, read out or biasing electronics could be formed integrally in whole or in part in material layers formed adjacent to and in electronic communication with the photodetector. ROIC 300 applies appropriate bias on each junction through contact 20, with bulk absorber 110 or substrate 100 held at a common potential through contact 30.

Figure 2:
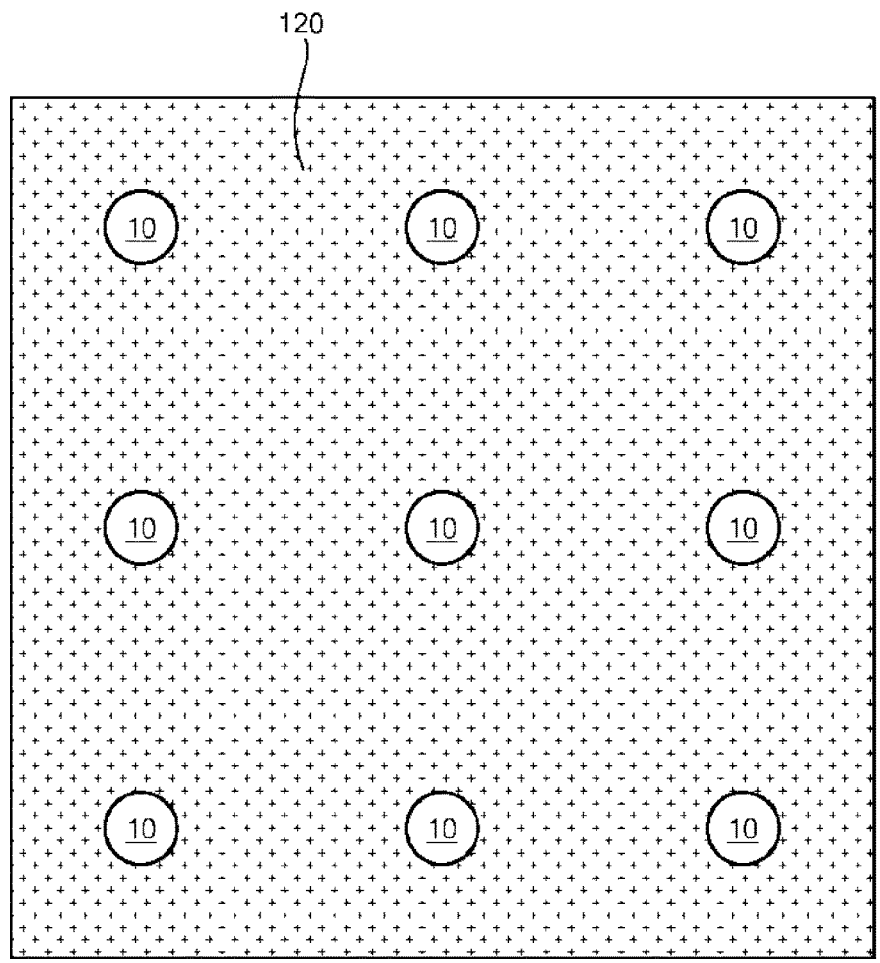
FIG. 2 shows a representative top surface planar views for a rectangular conventional DLPH photodetecting array configurations.
Figure 3:
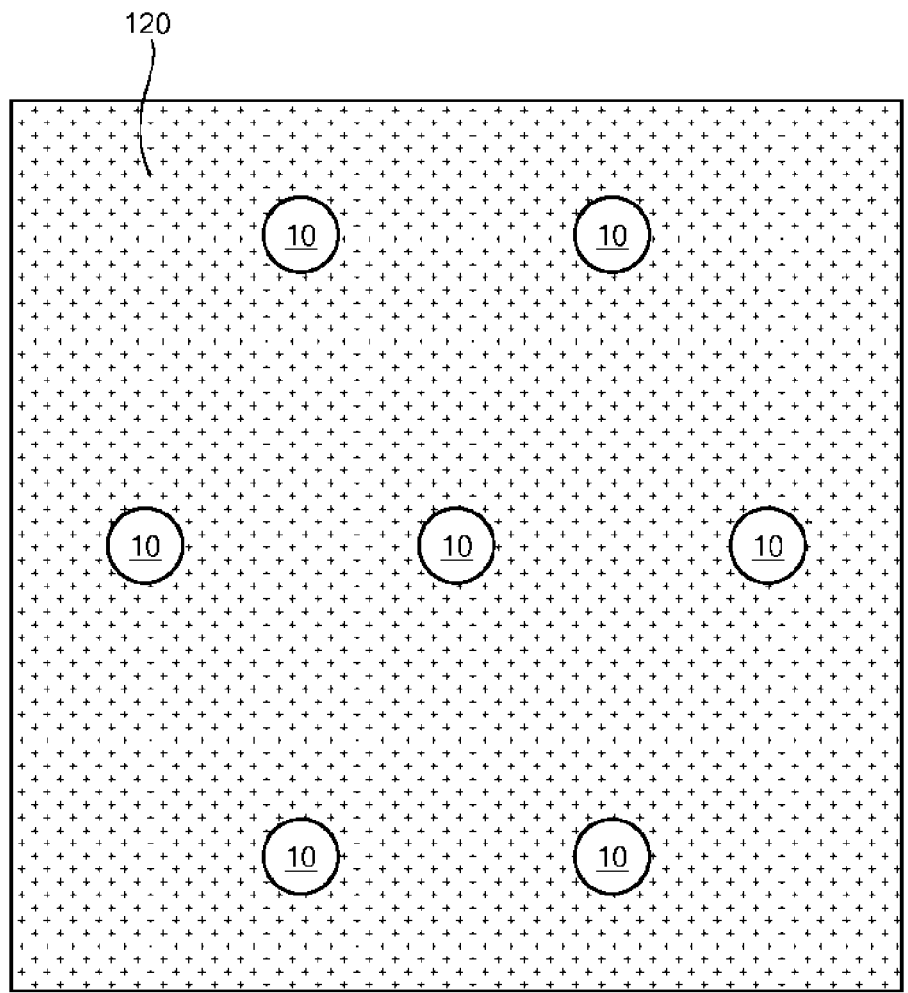
FIG. 3 shows a representative top surface planar view for a hexagonal conventional DLPH photodetecting array configurations.

The DLPH structure shown in FIG. 1 can be used to form linear arrays of photodetectors, such as a series of photodetectors located along a single line. Alternatively, the same DLPH structure can be used to form planar or two dimensional photodetector arrays. FIGS. 2 and 3 show planar views for a photodiode and its nearest neighbors in typical two dimensional photodetector array subsections, viewed at the top surface of the widegap cap layer 120, with photodiodes arrayed in rectangular (FIG. 2) or hexagonal (FIG. 3) configurations. Typical high-density format arrays can include millions of such symmetrically arrayed photodiodes.

Non-reflected incident photons with energy below the substrate bandgap pass through the substrate and are generally absorbed in the narrow gap absorber layer 110, generating electron-hole pairs. If the absorber layer is not fully depleted, the minority carriers—holes in an n type absorber—will diffuse towards the depletion region formed around a proximate photodiode. The electric field in the depletion region at the relevant photodiode sweeps the minority carriers into the p-n junction, where they drift and diffuse towards the associated surface contact and are as photocurrent. Minority carriers thermally generated in the narrowband absorber also diffuse towards the depletion region around a proximate photodiode, where they are also separated from majority carriers and swept into the p-n junction as dark diffusion current.

Figure 4A:
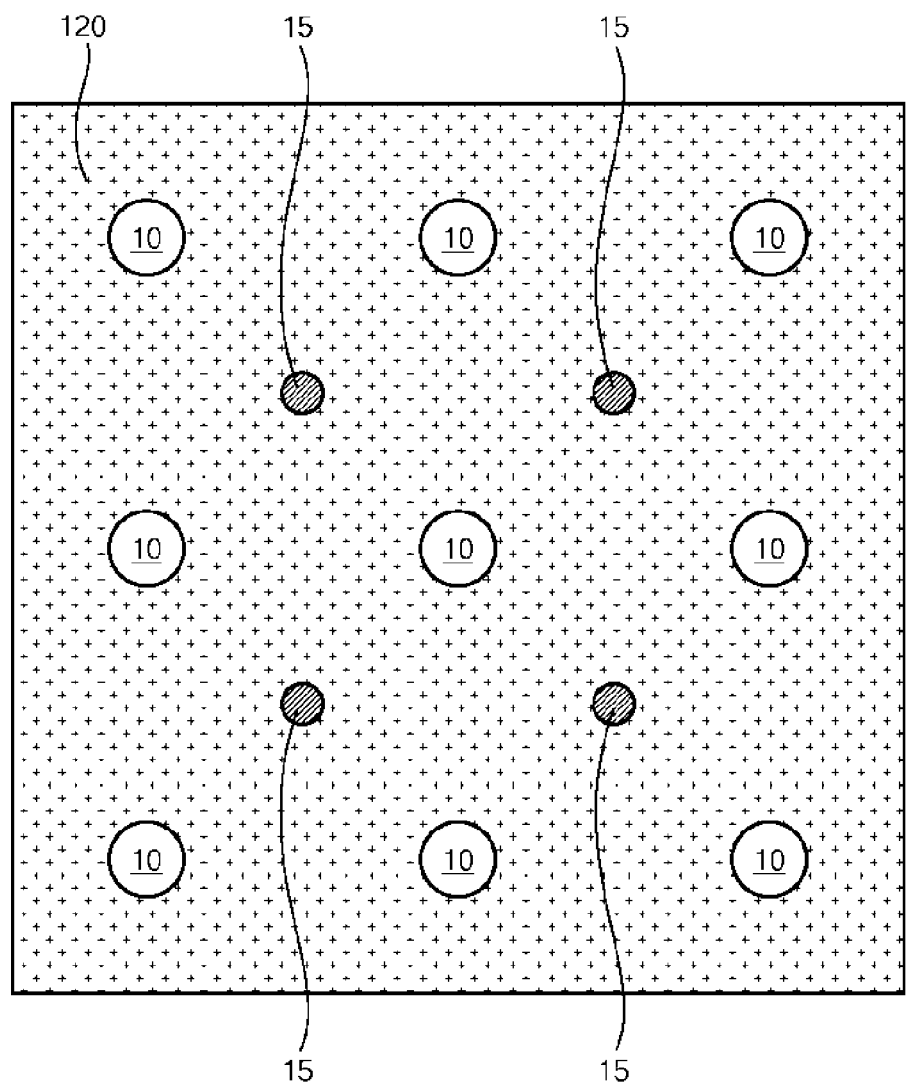
FIGS. 4(a)-4(e), collectively referred to as FIG. 4, show planar views of representative photodiode arrays according to exemplary embodiments of the present invention.
Figure 4B:
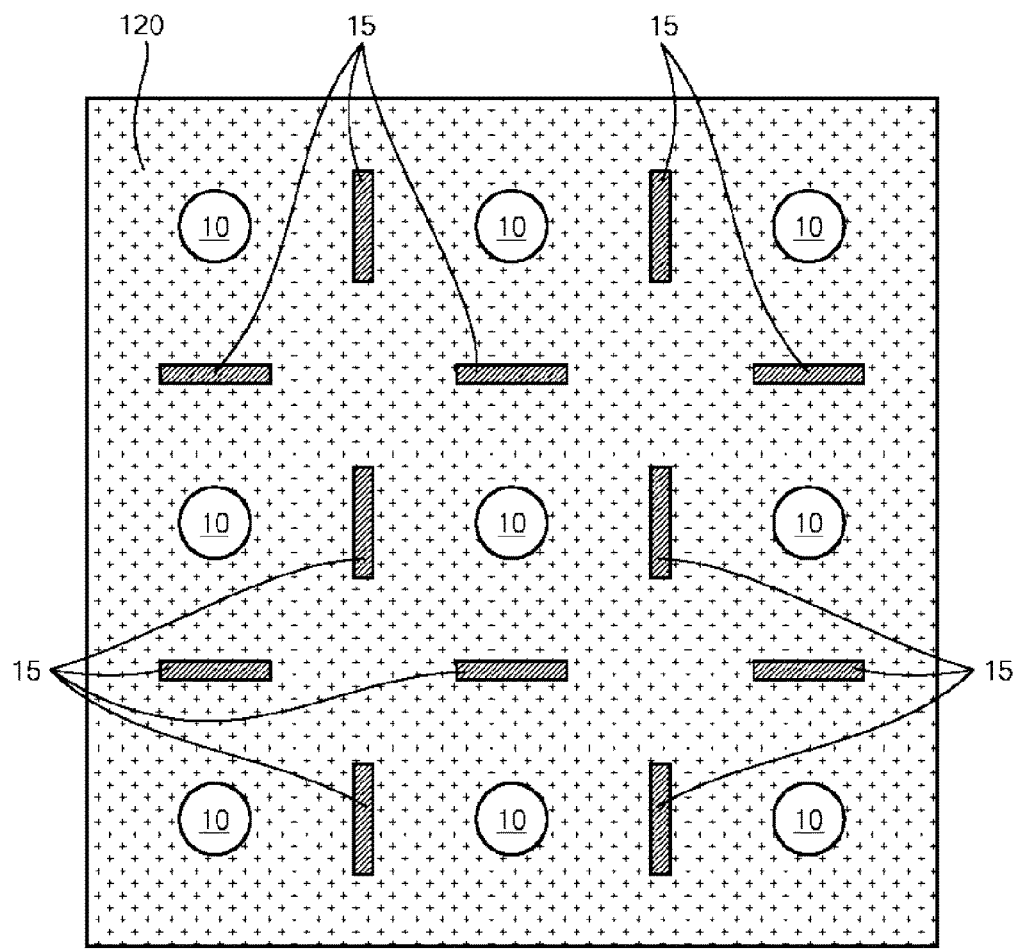
Figure 4C:
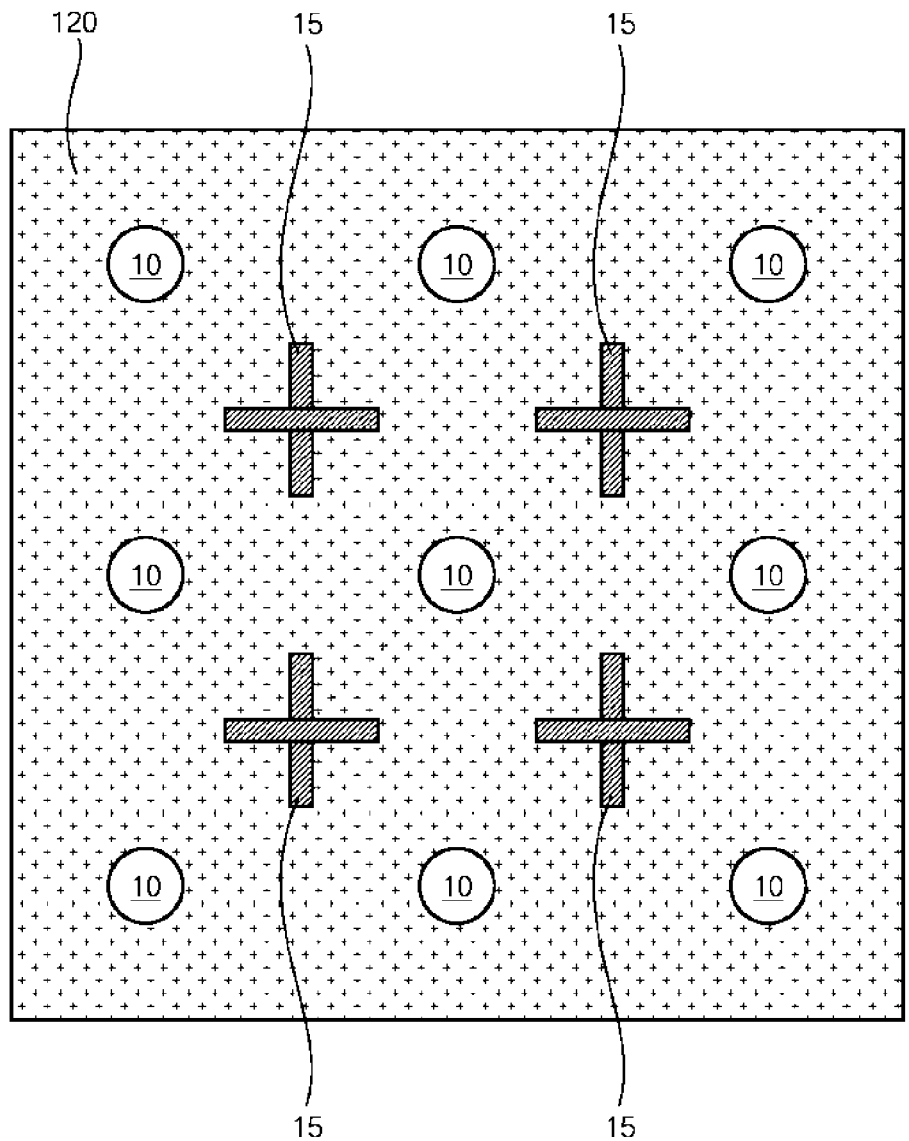
Figure 4D:
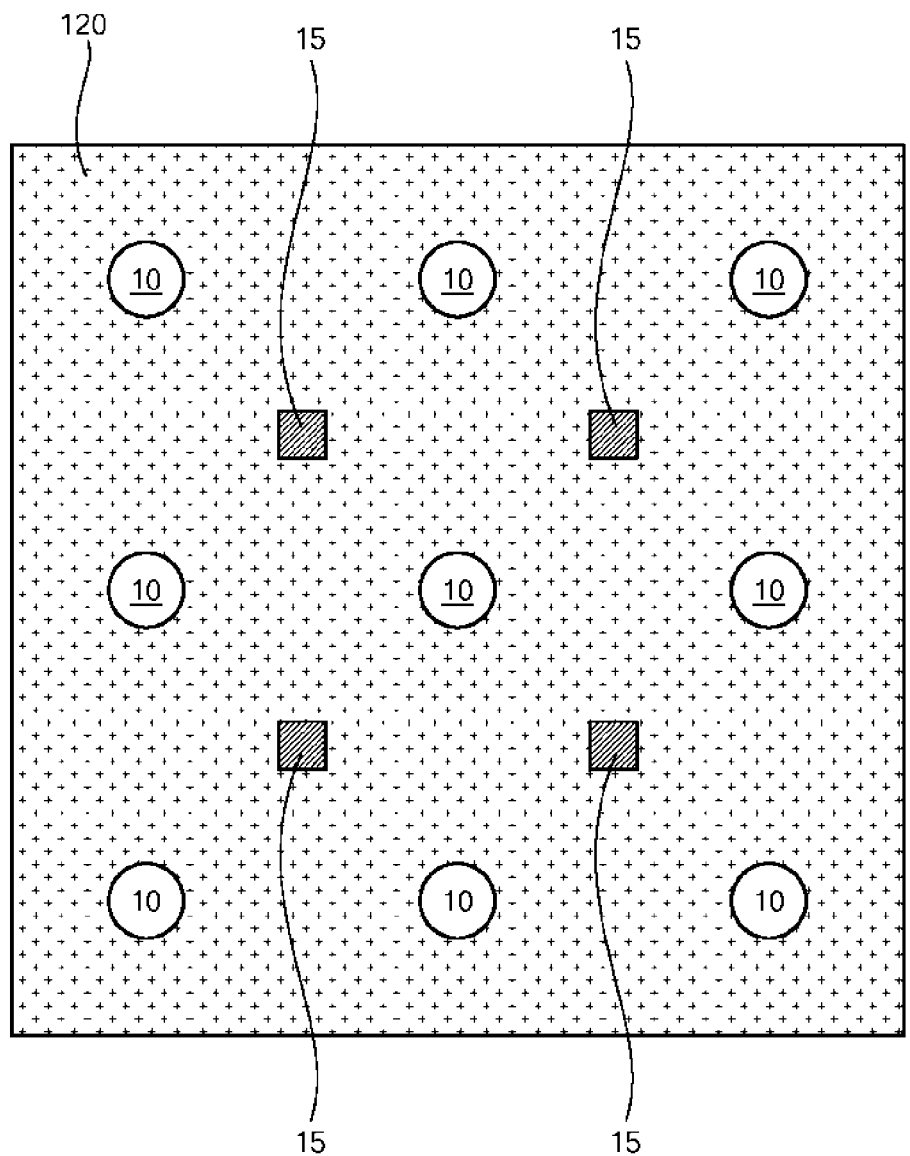
Figure 4E:
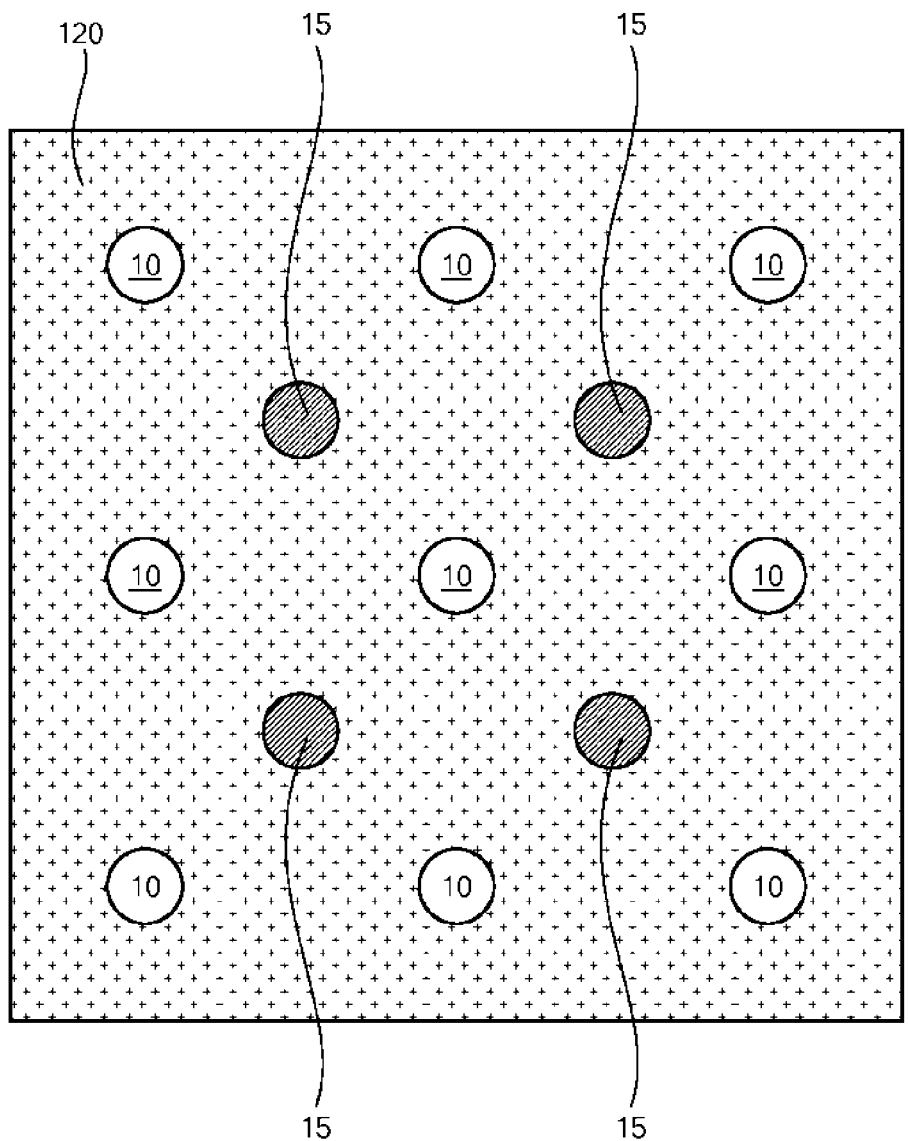
Figure 5:
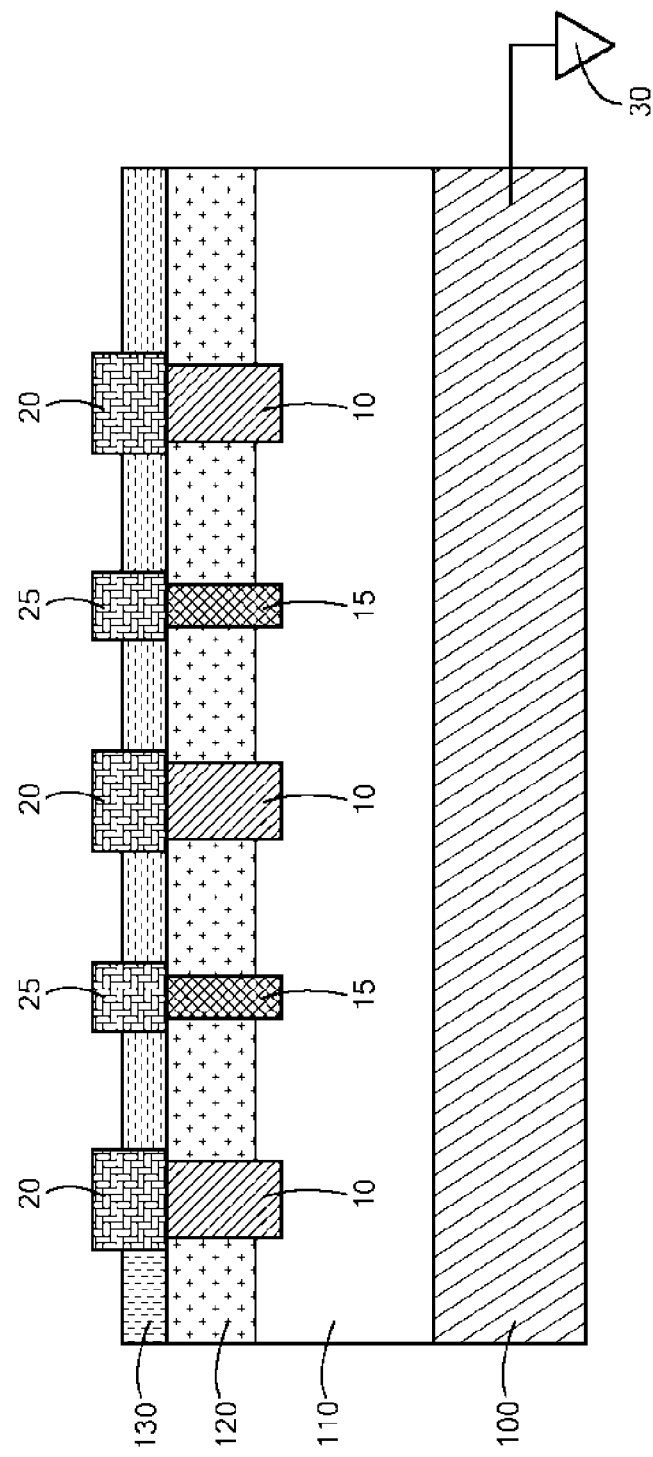
FIG. 5 shows a cross sectional view of a photodiode array according to an exemplary embodiment of the present invention.

By comparison to the prior art structures shown in FIGS. 1-3, FIG. 4(a) shows an exemplary embodiment of the invention in a planar view corresponding to the top surface of a cap layer 120 for a DLPH structure using diffused p-n junctions. In particular, FIG. 4(a) shows diffusion control junction (DCJ) diffusions 15 disposed between rectangularly-arrayed diffusions 10. FIG. 5 shows a cross sectional view of the DLPH through photodiodes 10 and diffusion control junctions 15, corresponding to a cut along a diagonal in the FIG. 4(a) planar view. FIGS. 4(b), 4(c), 4(d) and 4(e) show alternative exemplary embodiments of the invention having DCJ diffusions with alternative location, shape and feature sizes relative to diffusions 10 or the cylindrical DCJs depicted in FIG. 4(a). In each case a DCJ 15 is more proximate to the nearest photosensor diffusion 10 than the nearest photosensor diffusion 10 is to any neighboring photosensor diffusion 10. The diffusion control junctions 15 are or can be formed in several shapes including a bar shape, a cross shape, a star shape, a square shape, an arc shape and a circular shape.

Diffusion control junction diffusions 15 are formed with the same type doping as diffusions 10 that comprise the photodiodes. The diffusion control junction diffusion 15 forms a p-n junction at the metallurgical junction or diffusion control junction (DCJ) with the oppositely doped (or intrinsically doped) bulk material 110 or 120. When combined in a focal plane array, each DCJ can be electrically connected through contacts 25 to DCJ biasing circuit 400 of FIG. 7(b). When reverse biased so that the electrostatic potential drop across a depletion region proximate to a DCJ is the same or greater than the potential drop across a depletion region associated with a proximate photodiode p-n junction, the DCJ will influence minority carrier densities at the edge of depletion regions around proximate photodiodes.

Figure 8:
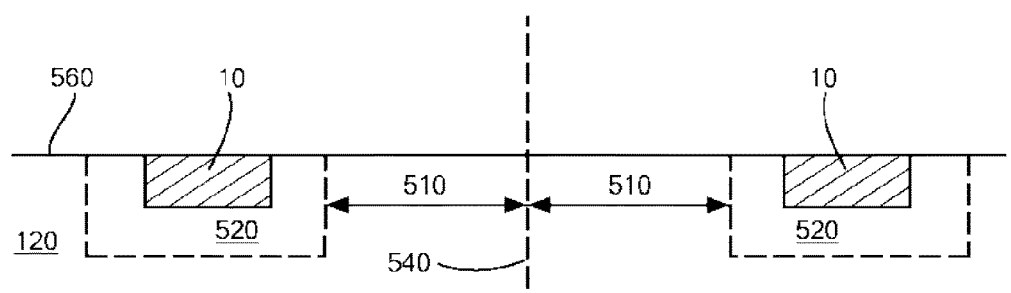
FIG. 8 illustrates minority carrier diffusion length.

As shown in FIG. 8, when there is less than twice a minority carrier diffusion length 510 between the edge of a depletion region 520 around a photodiode 10, and the edge of a depletion region 520 around a nearest photodiode 10, the presence of a DCJ will tend to suppress the minority carrier density at a symmetry plane 540 between the diodes. The DCJ placement, therefore, is selected by reference to minority carrier diffusion lengths for the particular absorber material at intended operating temperatures or ranges, given relevant doping levels, DCJ and photodiode feature sizes, intended bias levels, and the particular photodiode center to center separation (pitch) for the device.

As explained above, the dense array suppresses the minority carrier gradient at the lateral edge of the depletion region around a photodiode, thereby suppressing the dark diffusion current. The resulting volume from which the proximate photodiode collects minority carriers will depend in detail on the geometric configuration of the proximate DCJs and the reverse bias applied to those DCJs. As the reverse bias on the DCJ increases relative to the reverse bias on a proximate photodiode, the lateral minority carrier gradient at the edge of the photodiode depletion region can fall proportionately faster than the photodiode photocarrier collection volume, thereby decreasing dark current faster than photocurrent and improving signal to noise ratios for the extracted current.

The DCJ architecture can also provide dark current suppression with interesting features. For example, the dense array dark current suppression increases as pitch (photodiode center-to-center separation) is reduced. In the conventional DLPH array, however, reducing pitch also reduces the volume associated with each photodiode that is available for generating photocarriers. The smaller photocarrier generation volume means a lower optical signal or photocurrent per photodiode. With the DCJ architecture, however, the photodiode array geometry can suppress dark current in arrays still having relatively large pitch dimensions, and therefore does not require a reduction in photocarriers per photodiode comparable to that resulting from simple pitch reduction for a conventional photodiode array. In other words, the DCJ architecture largely avoids this tradeoff and provides the signal collecting benefit of larger pitch with the dark current suppression of smaller pitch dense arrays.

The DCJ architecture also provides more dark current suppression as temperature increases. In other words, as the dark diffusion current becomes a larger percentage of the dark current, the DCJ provides proportionally larger dark current suppression for the photodetector.

The particular diffusion control junction (DCJ) structural details provide several degrees of freedom for design optimization. For example, subject to manufacturing technology limitations, the DCJ feature shape, dimensions, junction depth, doping, placement, bias range, and electrical connectivity can all be selected independent of the choices applied to the photodiodes themselves, or to other DCJs on the same photodiode array.

It is understood, for example, that the rectangularly-arrayed photodiodes and diffusion control junctions in FIG. 4 are exemplary configurations. The photodiodes themselves can be arranged in any desired configuration, including the hexagonal configuration shown in FIG. 3. DCJs can be located on lines between neighboring diffusions 10. Given a photodiode array configuration, the DCJs can be placed at any desired location subject to the minority carrier diffusion length considerations described above. The photodiodes, and diffusion control junctions, can be arrayed in any desired fashion to form a two-dimensional planar, or one-dimensional linear, photodiode array. For example, FIG. 5 could represent 2D or 1D illustrations.

Although FIG. 4(a) depicts DCJs with a circular planar feature profile, it is understood that this embodiment is exemplary. The DCJs can be given any desired, and manufacturable, shape and dimension. Nor are the DCJs dimensions limited by the photodiode feature size. For example, photodiodes 10 might be formed as cylindrical diffusions with a radius of 2 um and pitch (center to center planar separation) of 15 um in InGaAs (for example $In_{(1-x)}Ga_{(x)}As$) on InP DLPH. Corresponding DCJs can be formed with smaller radius cylindrical diffusions located, as shown in FIG. 4(a), on a diagonal bisecting proximate photodiodes. Alternatively, the DCJs can be formed in any desired feature shape, such as a bar, cross, star, square, arc, and so on. The feature shape and dimensions are limited by manufacturing process technology requirements and, where the DCJs are externally biased, connectivity technology requirements.

In addition, although FIG. 4 depicts DCJs symmetrically arrayed around each photodiode, it is understood that this architecture and DCJ placement is exemplary. There is no requirement to place DCJs in a symmetric pattern on an array in order to suppress the lateral dark diffusion currents according to the invention.

In alternative embodiments, the DCJ 15 can be formed with the same diffusion process, or dopant, or doping levels, as photodiode diffusions 10. While these design choices may be beneficial for processing ease, it is not necessary for DCJ operation. For example, in another embodiment, the DCJ 15 can be formed with a different dopant concentration (or dopant) than photodiodes 10. For example, the DCJ doping concentration might be increased relative to doping concentration in photodiodes 10 to provide a higher built in voltage in DCJs 15 than in photodiodes 10 so that if all photodiodes 10 and DCJs 15 are subject to the same reverse bias, the DCJs will have a larger electrostatic potential drop across associated depletion regions than photodiodes 10.

In an alternate embodiment, if the built-in voltage drop across the DCJs is larger than the voltage drop across the photodiodes under their operating reverse bias, then the DCJs could be fabricated without contacts 25 or electrical connection to biasing circuit 400, and would thus suppress lateral dark diffusion currents in proximate photodiodes relying solely on the DCJ built in voltage.

The biasing scheme applied to the DCJ provides yet another free design parameter. For example, in one embodiment, as noted above, the DCJ do not require electrical connection to a biasing circuit. Instead, the DCJ built in voltage due to the dopant concentration in the DCJ suppresses the lateral dark diffusion current in proximate photodiodes.

The contacts 20 and 25 may connect with the respective diffusions via an indium bump per diffusion.

In another embodiment, DCJ biasing circuit 400 can connect each DCJ to a common bus, providing a common voltage set point or bias relative to common terminal 30 setting the potential (or boundary potential) on substrate 100 or absorber 110. In another embodiment, contacts 25 for each DCJ can be electrically connected on the photodetecting array providing a single DCJ bias connection point. In another embodiment, the electrical connection tying each DCJ contact 25 together can be formed by metallic connection above the top surface of the passivation layer 130.

Alternatively, as described below, the DCJs can be grouped into subsets by row, column, diagonal, or any other geometric pattern, and the contact 25 for each DCJ in such subgroup electrically connected in common to share a common bias set point. In such an embodiment, DCJ biasing circuit 400 can be configured to apply differential bias levels to the different DCJ groupings according to a desired scanning pattern or method. In yet another embodiment, DCJ biasing circuit 400 is also configured to sense current or voltage on each individual DCJ or a subset grouping of DCJs.

Figure 7B:
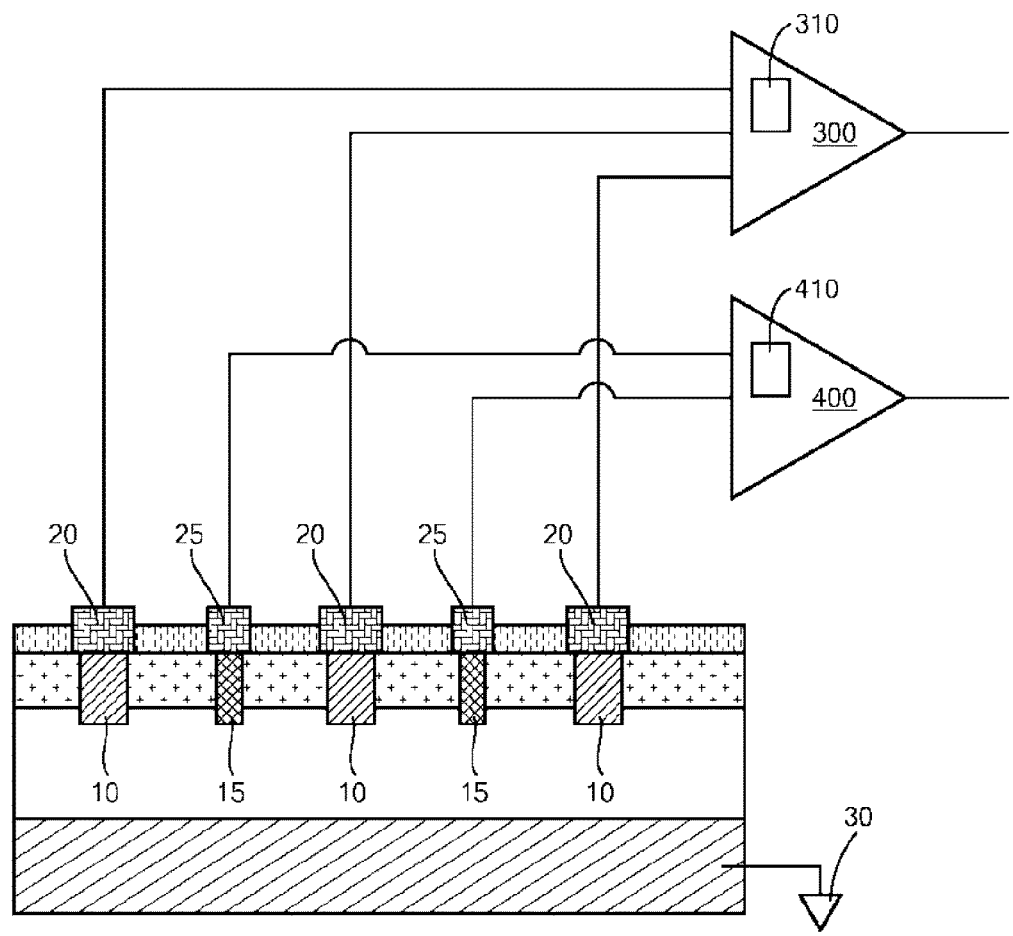

The DCJ bias level provides yet another free parameter, in addition to the structural configuration for the DCJ bias network. For example, biasing circuit 400 can be configured to apply the same potential to each DCJ, or a particular group of DCJ, as ROIC 300 applies to each photodiode. Alternatively, biasing circuit 400 can be configured to apply a variable or adjustable reverse bias to each DCJ or a group of DCJ. FIG. 7(b) shows the exemplary alternative view with separate DCJ biases. Because the lateral dark current suppression will generally increase with the relative reverse bias on a DCJ as compared to a proximate photodiode, adjusting the relative reverse bias on a DCJ or group of DCJ relative to a photodiode or group of photodiodes can provide a mechanism to increase local sensitivity for that portion of the photodiode array. Alternatively, configuring biasing circuit 400 to provide adjustable DCJ bias on one or a set of DCJ can provide a mechanism to optimize photodiode array performance in response to variations in manufacturing processes, potential distributions across the photodiode array when in operation, or resulting photodiode performance in the absence of variable DCJ biasing.

While DCJ bias set points, for one or more DCJ, could be held constant during optical detection, in other embodiments the DCJ biasing can be dynamically adjusted. For example, if the steady state bias on one or more photodetectors drifts over time during array operation, the resulting change in the depletion region around such photodetectors can alter the dark current magnitude. Electronics and control logic 310 and 410 can be included in ROIC 300 and biasing circuit 400 to benchmark dark current with the photodetecting array shuttered, and using that information biasing circuit 400 can increase reverse bias on proximate DCJs to compensate for the bias drift on the photodetectors causing the higher quiescent dark current.

Alternatively, ROIC 300 and biasing circuit 400 can be configured with logic circuitry 310 and 410 respectively to implement particular photodiode sensing schemes, such as sensing the photodiode array by row or column. In another embodiment, biasing circuit 400 can adjust the bias on one or more DCJs in coordination with ROIC 300 photodiode signal sensing and extraction so as to provide a focused high-sensitivity detection. In other words, because increasing the reverse bias on a DCJ further suppresses dark current at proximate photodiodes at the cost of higher biasing power consumption, dynamically increasing bias on a set of DCJs can provide higher sensitivity for a subset of photodiodes—like a set of photodiodes grouped by row or column or clustered—DCJ bias to one or more, or one or more groups, of DCJ could be varied such as by logic 410 to selectively reduce dark current across a particular geometrical subsection of the array in coordination with the ROIC sensing and signal extraction pattern.

While the foregoing discussion has made reference to the DLPH structure shown in FIGS. 1-5, it is understood that the invention is not limited to diffusions or a DLPH photodetector structure. For example, one or two dimensional photodetector arrays can be formed with photodiodes 10 and DCJs 15 diffused in a bulk absorber like Si or short wave $Hg_{(1-x)}Cd_{(x)}Te$ without a widegap cap layer.

While the present discussion describes various embodiments of the invention in the context of diffused junctions, the invention is not limited to this context. As known in the art and discussed further herein, for example, photodiodes can be formed without using diffusion or ion implantation processes, such as by using a Schottky contact 152 to create a depletion region (such as depletion region 151 in FIG. 6(d) described below) that extracts photogenerated minority carriers from an absorber layer, or by forming mesas in a suitably doped epitaxial layer that locates a metallurgical p-n junction at an interface with the absorber layer. As a result, the invention can be used in mesa architecture.

For example, it is well-known in the art to form photodiode arrays by etching mesas in a widegap epitaxial layer formed on top of an oppositely doped absorber layer 110. In another embodiment of the invention, p-n junction photodiodes 10 and DCJs 15 can be formed from mesas in this manner rather than diffusing dopants to form junctions. In yet another embodiment, the p-n junction photodiodes 10 and DCJ 15 can be formed by etching mesas in epitaxial layers of oppositely doped bulk material having the same bandgap as the absorber.

Figure 6A:
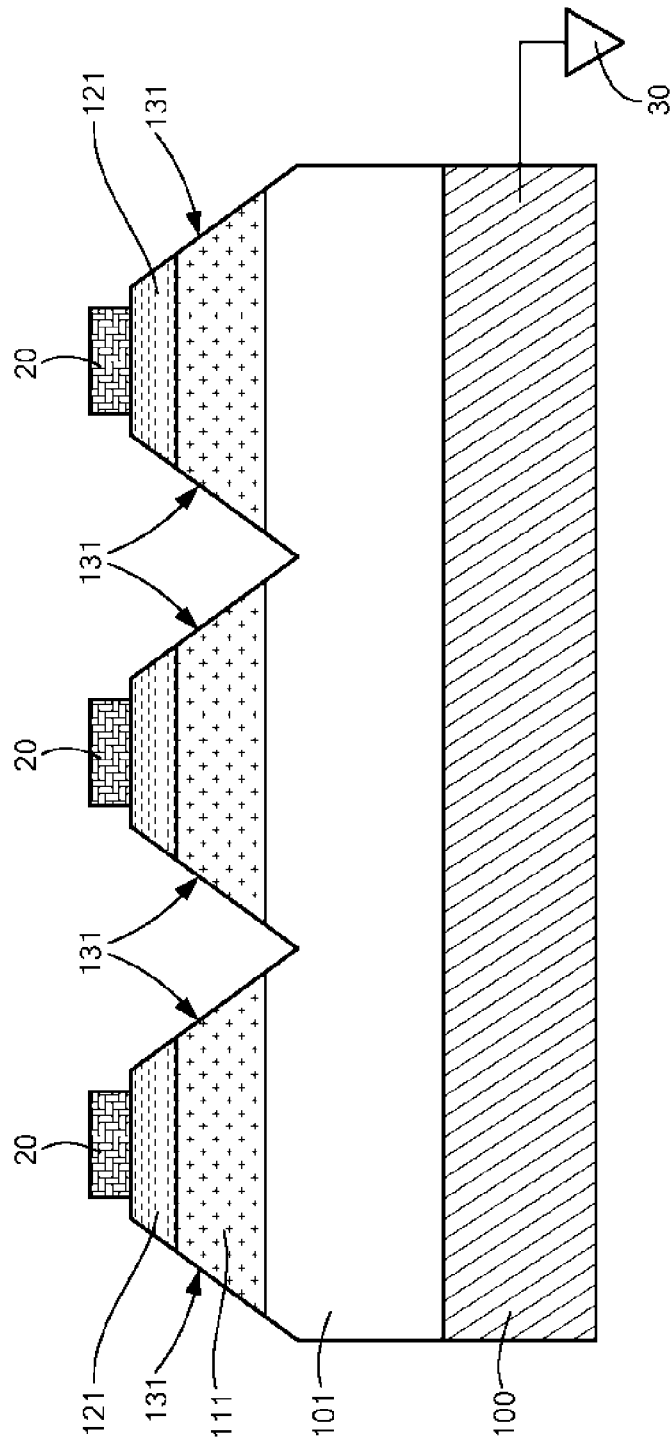
FIGS. 6(a)-6(d), collectively referred to as FIG. 6, show cross sectional views of a two color photodiode arrays.
Figure 6B:
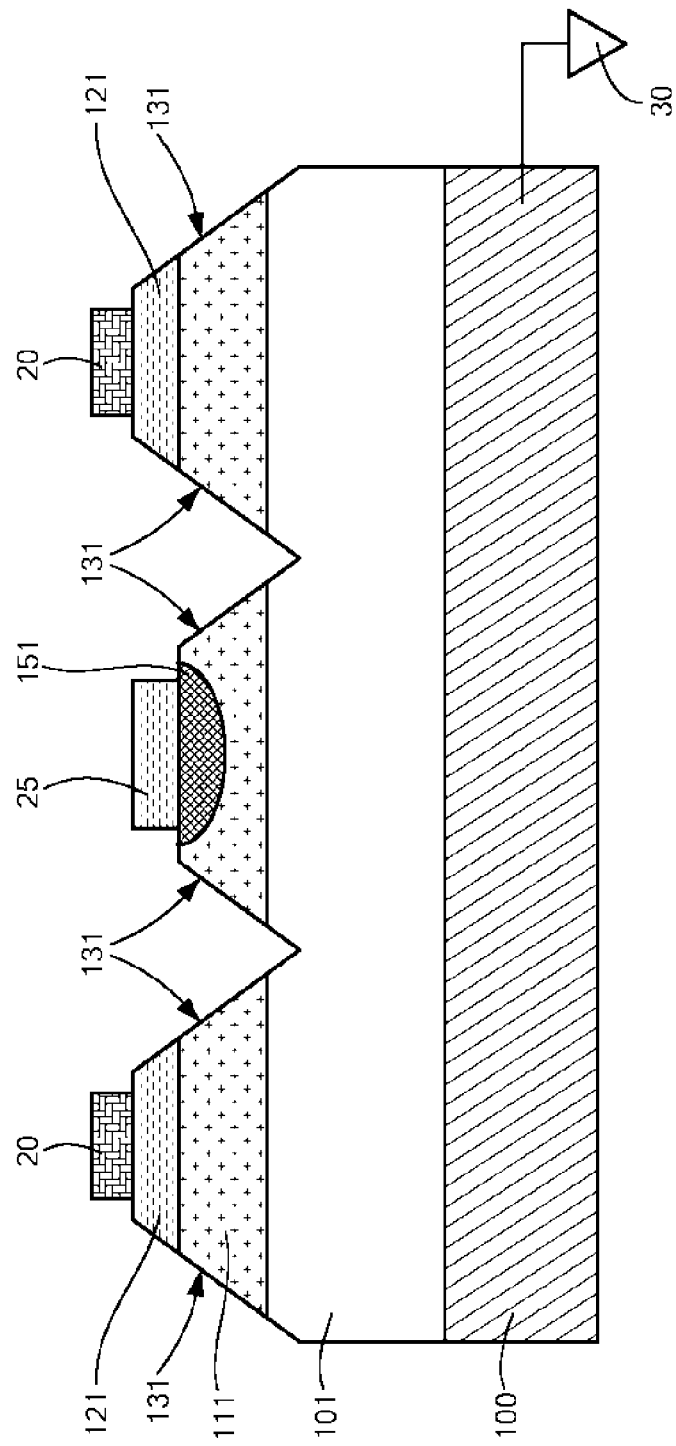
Figure 6C:
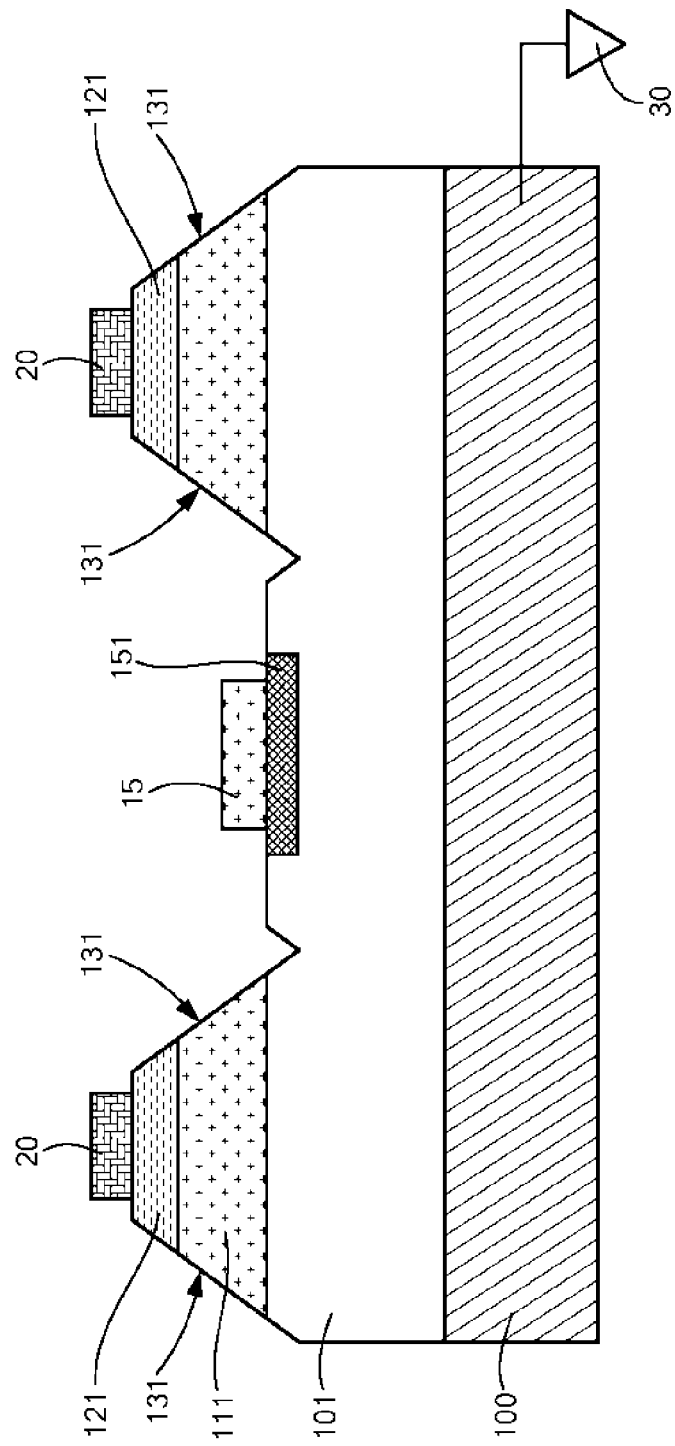
Figure 6D:
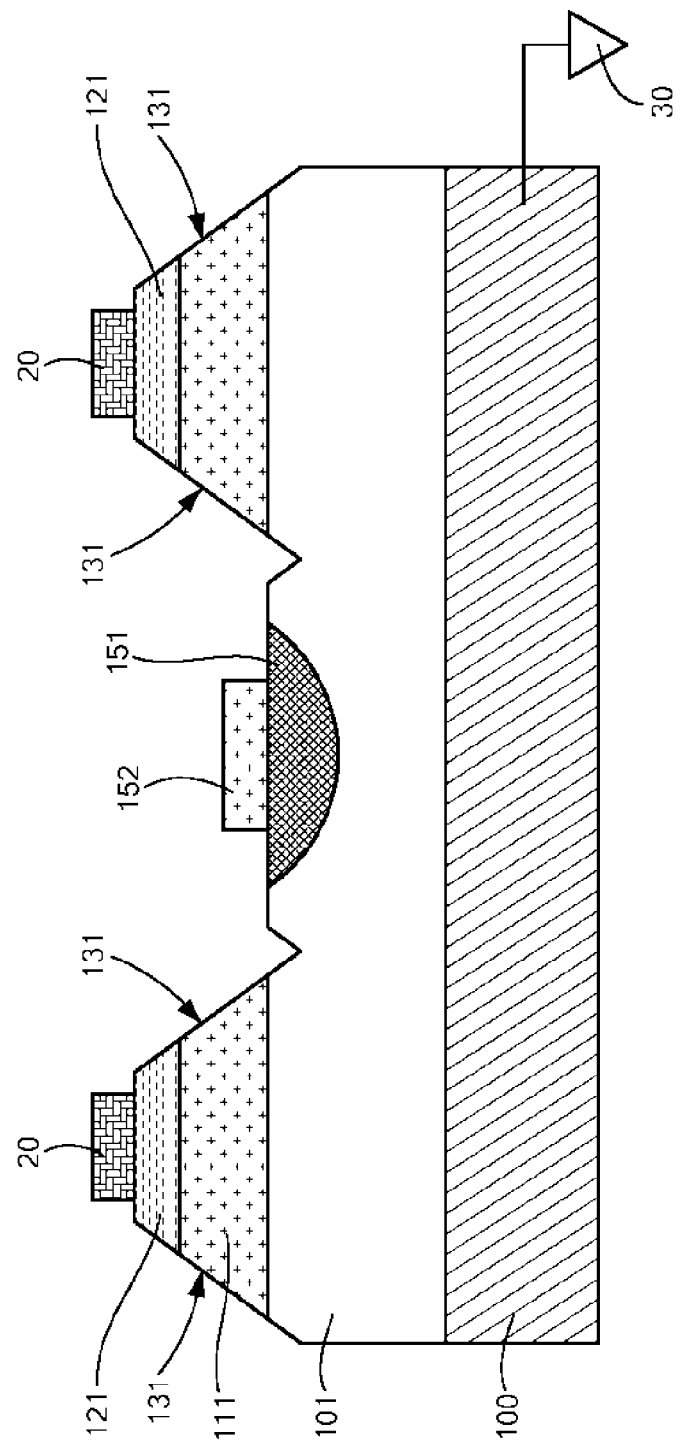

In yet other embodiments shown in FIGS. 6(a)-(d), DCJs can be formed in mesas configured for two-color detection. FIG. 6(a) shows in cross section a conventional prior art two-color mesa detector structure with absorber layers 101 and 121 oppositely doped and having different cutoff wavelengths to detect different wavelengths known in the art. For example, 101 can be a widegap p type absorber, with a widegap n type base 111 formed above it, and a narrow gap n type absorber 121 formed on top of base 111. This epitaxial stack thus forms back-to-back photodiodes having different color sensitivities, and the relevant color (wavelength) signal is selected by changing the bias applied to contact 20s formed in communication with absorber 121. The mesa, and an individual two-color detector, is formed by etching through layers 121, 111, and into absorber 101, then passivated with a suitable material 131 over the exposed areas.

The mesa designs above show various diffusion or contact embodiments which can be used as well in the embodiments of FIGS. 4(a)-(e).

In either case, DCJs can be formed laterally between two-color detector mesas to suppress lateral minority carrier diffusion between photodiodes in absorber 101. Such DCJs can be formed in any of the methods described above, such as diffusion, ion implantation, epitaxial mesa, and so on.

Figure 7C:
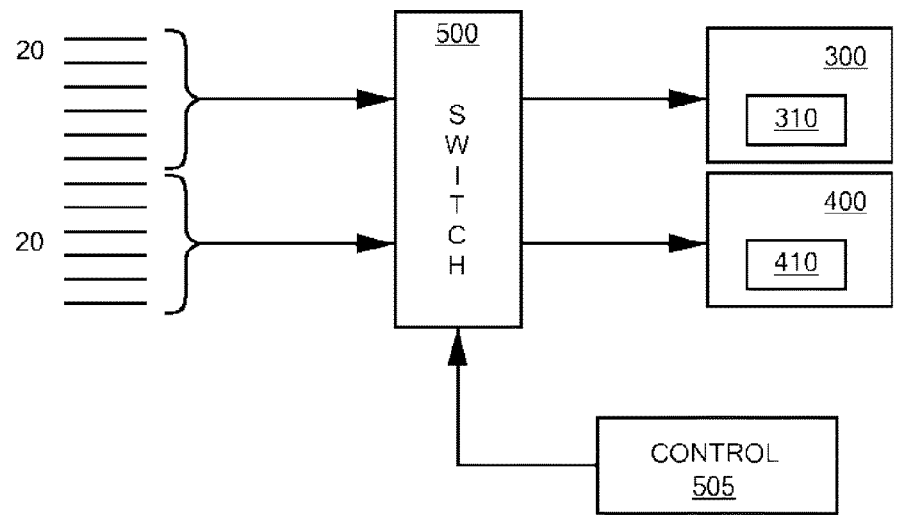

In an alternative control circuit of FIG. 7(c) for applying adaptive bias to dense conventional photodiode arrays, the contacts 20 are connected to a switch 500. Control signals instruct the switch 500 to place individual contacts 20 in communication with either biasing and readout electronics 300 or DCJ biasing circuit 400. Thus, each photodiode in the dense array can operate as either a photodiode or a dark current impeder acting like a DCJ based on how the switch 500 is instructed. As shown there the contacts 20 are applied to a switch 500 under computer control 505 to selectively connect a desired set of contacts 20 to the electronics 300 and the others to electronics 400. In this manner the selected contacts 20 can be operated to create depletion regions in the layer 101 for dark current suppression.

The two-color detector can be modified as shown in FIG. 6(b) without the layer 121 and the DCJ contact 25 formed on a diffusion 151 which can be formed through selected bases 111 or widegap layer with opposite doping from layer 101. These can be formed as hetero- or homojunctions as above. The DCJs can be placed in any desired pattern. The DCJs need not be placed on the layer 111, for example, as shown in FIG. 6(c) DCJ 15 is formed directly on layer 101 with the diffusion 151 extending into the layer 101. DCJ function can also be accomplished with a Schottly contact 152 directly on layer 101 (see FIG. 6(d)) which when energized at the desired voltage provides an appropriate depletion region 151 below it to block dark current as noted above. The Shockley barrier can be used in the structures above as well.

As noted above, the individual DCJ design parameters can be optimized for desired performance, including DCJ mesa shape, lateral dimensions, etch depth, and placement relative to the two-color photodiode mesas. A particular DCJ configuration can be different from those used for photodiodes or other DCJs.

Photodiodes 10 or DCJ 15 can be formed using Schottky contacts instead of diffused junctions in the embodiments above.

In an alternative embodiment of the invention, dense conventional photodiode arrays can be operated using adaptive biasing. Conventional photodiode arrays are typically operated with each photodiode under a uniform reverse bias. In particular, the invention concerns conventional linear or two dimensional photodiode arrays in which the distance between the lateral edge of depletion regions around neighboring photodiodes under normal operating bias and operating temperature is less than two minority carrier diffusion lengths.

In one embodiment, for such arrays, instead of extracting signal while subjecting photodiodes to uniform reverse bias, a subset of photodiodes are identified as sensing photodiodes by logic 310. The sensing diodes are biased at the normal, low, operational bias. The remainder, non-sensing photodiodes, are subject to a larger reverse bias than the sensing diodes. The larger reverse bias is called the adaptive bias. When subject to the adaptive bias, the non-sensing photodiodes will suppress the lateral dark diffusion current in the proximate sensing diodes. This can provide a new type of high sensitivity detection or operating mode for existing photodiode array architectures.

As explained with reference to the DCJ embodiments above, the adaptive biasing scheme can take different forms. For example, in one embodiment sensing diodes can be defined as one or more rows or columns subject to low reverse bias in the photodiode array, with intervening rows or columns subject to adaptive biasing. In another embodiment, the ROIC can be configured to define a series of different sensing diodes and suppression junctions over time. So, for example, a first column can be configured as sensing diodes with low bias while a neighbor column is configured as suppression junctions with adaptive bias.

After reading signals from the sensing diodes, individually or by column, the sensing diodes can be reconfigured as suppression junctions by applying the higher adaptive bias, while the neighboring column can be reconfigured as a sensing column with low bias. The ROIC then extracts signal from the new sensing diodes. In a rectangular photodiode array, for example, this biasing scheme and sequence can provide high sensitivity sensing by extracting signal from odd, then even, column or row photodiodes.

In another embodiment, the ROIC can define suppression junctions by applying adaptive bias to each nearest neighbor for a particular sensing diode. As suggested for the row/column sequencing discussion, the sensing diode and suppression junction configuration can be stepped across the photodiode array in sequential fashion. In each case, the ROIC can be configured to apply a fixed adaptive bias on each suppression junction, or to apply a variable (increasing reverse bias) adaptive bias to each such junction, for a given configuration. Logic described above operates to provide these diverse biasings.

Depending on the particular sensing diode and DCJ configuration for a given photodiode array, the presence of the DCJ can reduce the array fill factor. For an individual scan this may result in a non-contiguous array. Although the DCJs will alleviate constraints on modulation transfer due to crosstalk, it introduces other constraints associated with the reduced fill factor and larger sampling interval, and can therefore reduce a corresponding total modulation transfer function or spatial frequency resolution. Therefore, in another embodiment, the high sensitivity signals from sensing diodes extracted in a given read out interval can be integrated with signals from the new sensing diodes under one or more subsequent signal read intervals out to form a combined high sensitivity signal across the photodiode array.

The DCJ of one embodiment of the invention does not need to fully enclose a signal junction or diode, it can be tailored in shape, size, placement, doping, and operating bias to minimize suppression penalty while still suppressing lateral diffusion current.

As a further point, the tradeoff between photocurrent and dark current suppression in a dense array introduces new concerns not addressed in the past. This can be better understood by considering signal to noise ratio (SNR) and detectivity D* for the dense array. We take photocurrent as $i_{sig}$ as proportional to the effective optical volume for a given pixel, often treated in terms of an optically effective area $A_d$ (at given absorber thickness). The dark current is a component in noise current $i_n$, and the SNR is simply $i_{sig}/i_n$. With this formalism, the DCJ dark current suppression increases signal to noise ratio (SNR) $i_{sig}/i_n$ by reducing $i_n$, but each DCJ also reduces the optically effective volume (area), and therefore photocurrent $i_{sig}$, associated with each pixel. The net effect on SNR therefore depends on the relative changes that the DCJ imposes on signal and noise current. Optimizing the effect of detector volume to dark current suppression is an important contribution of this invention.

The junctions or their diffusions or the effects thereof can be made by any technique including those known in the art such as by diffusing in dopants, by ion implantation, by the interface between epitaxial layers as in mesa architecture or as a Schottky contact on semiconductor layers.

The photosensor device of the invention may be comprised of a metal-insulator-semiconductor device, an nBn or pBp barrier device, a Schottky device, a homojunction device, a heterojunction device, a p-i-n device, a multicolor device, or any other device architecture known in the prior art to control minority carrier populations.

While some embodiments of the invention have been described by way of illustration, it will be apparent that the invention can be carried into practice with many modifications, variations and adaptations, and with the use of numerous equivalents or alternative solutions that are within the scope of persons skilled in the art, without departing from the spirit of the invention or exceeding the scope of the claims.

The invention claimed is:

1. A photosensor device comprising:
   a photon absorbing layer;
   at least two photosensor diffusions in said absorbing layer, said at least two photosensor diffusions in said absorbing layer having the edges of the diffusions thereof separated in said absorbing layer by less than two minority carrier diffusion lengths; and
   at least one diffusion control junction diffusion in said absorbing layer in proximity to two photosensor diffusions, wherein any said diffusion control junction diffusion forms a homojunction with said photon absorbing layer.

2. The photosensor device of claim 1 comprising a dense photosensor array having said at least two photosensor diffusions therein.

3. The photosensor device of claim 1 having a plurality of said diffusion control junctions diffusions proximate to each photosensor diffusion.

4. The photosensor device of claim 1 wherein each diffusion control junction diffusions is more proximate to a neighboring photosensor diffusion than any of said photosensor diffusions are proximate to any other said photosensor diffusion.

5. The photosensor device of claim 1 wherein each diffusion control junction diffusion has a similar or higher doping concentration relative to a doping concentration of each said photosensor diffusion.

6. The photosensor device of claim 1 wherein each said diffusion control junction diffusions are formed to have a built in voltage larger than a built in voltage of each photosensor diffusion.

7. The photosensor device of claim 1 wherein said photosensor diffusions exist in mesas of photon absorbing layers on a substrate.

8. A photo sensor device comprising:
   a photon absorbing layer;
   an array of diffusions in a predetermined pattern in said layer, wherein each diffusion in the array of diffusions forms a homojunction with said photon absorbing layer;
   a plurality of electrical connections to said layer, some or all being placed at positions in electrical communication to one of a plurality of said diffusions in said array; and
   means for selectively biasing each of said array of diffusions whereby some act as photo sensors while others act as dark current impediments.

9. The device of claim 8 wherein said biasing means periodically changes the biasing of said diffusions so as to cause one group of said diffusions to act as sensors in one period and another group of diffusions to act as impediments in said one period and to change said bias in another period to cause at least some of said diffusions to provide different ones of the sensor and impediment functions.

10. The photo sensor of claim 8 wherein some or all of said plurality of electrical connections are selected from the group comprising a Schottky connection, a second diffusion in said layer substantially the same as the diffusions in said first array and having means for biasing said second diffusion to act as a dark current impediment, and a second diffusion in said layer having doping different from doping of the first diffusions, the second diffusion doping being of a nature to allow said second diffusion to act as a diffusion control junction under bias.

11. A photosensor device comprising:
    a photon absorbing layer;
    at least two first structures, each first structure is configured to generate an associated photosensing depletion region in the absorbing layer, wherein the at least two first structures are separated by less than two minority carrier diffusion lengths; and
    at least one second structure configured to generate a diffusion depletion region in the absorbing layer, wherein the diffusion depletion region suppresses lateral minority carrier density gradients at an edge of at least one of the photosensing depletion regions, wherein each of the at least one second structure forms a homojunction with said photon absorbing layer.

12. The photosensor device of claim 11 wherein the at least two first structures comprise at least one of: a photosensor diffusion and a Schottky contact.

13. The photosensor device of claim 11 wherein the at least one second structure comprises at least one of: a diffusion control junction diffusion and a Schottky contact.

14. The photosensor device of claim 11 wherein the at least one second structure is formed to have a cross-section parallel with a surface of the photon absorbing layer which is one of: a bar shape, a cross shape, a star shape, a square shape, an arc shape and a circular shape.

15. The photosensor device of claim 11 wherein the at least one second structure comprises a plurality of second structures and the plurality of second structures are symmetrically arrayed around at least one first structure of the at least two first structures.

16. The photosensor device of claim 11, wherein the photosensor device further comprises a biasing circuit configured to selectively apply differential bias levels to each subset of a plurality of subsets;

wherein the at least one second structure comprises a plurality of second structures, each second structure is grouped into one subset of the plurality of subsets, and wherein each subset represents one of a row of second structures, a column of second structures, and a diagonal of second structures.

17. A method comprising:

applying a bias level to at least one second structure in an absorbing layer of a photosensor device of claim 11; and while applying the bias level, detecting a photogenerated minority carrier in at least a first structure of the at least two first structures.

18. The method of claim 17 wherein the at least one second diffusion comprises a plurality of second diffusions, the plurality of second diffusions comprises a first subset of second diffusions and a second subset of second diffusions, and wherein applying the bias level comprises applying a first bias level to the first subset of second diffusions and applying a second bias level to the second subset of second diffusions.

19. The method of claim 17, wherein each second diffusion of the at least one second diffusion is configured to operate as either a photosensor or a diffusion control junction, wherein applying the bias level to the at least one second diffusion is performed in a first mode, wherein the method comprises detecting, in a second mode, a photogenerated minority carrier in the at least one second diffusion, wherein the at least two first structures and the at least one second structure are configured to operate as photosensing structures in the second mode, wherein, in the first mode, the at least two first structures are configured to operate as photosensing structures and the at least one second structure is configured to operate as a diffusion control junction diffusion, wherein transitioning from the second mode to the first mode occurs by beginning to apply the bias level, and wherein transitioning from the first mode to the second mode occurs by ceasing to apply the bias level.

* * * * *